(12) United States Patent
Cao et al.

(10) Patent No.: US 12,048,112 B2
(45) Date of Patent: Jul. 23, 2024

(54) DISPLAY PANEL AND DISPLAY DEVICE

(71) Applicant: SHENZHEN CHINA STAR OPTOELECTRONICS SEMICONDUCTOR DISPLAY TECHNOLOGY CO., LTD., Guangdong (CN)

(72) Inventors: Weiran Cao, Guangdong (CN); Weiyao Wei, Guangdong (CN); Baixiang Han, Guangdong (CN)

(73) Assignee: Shenzhen China Star Optoelectronics Semiconductor Display Technology Co., Ltd., Guangdong (CN)

( * ) Notice: Subject to any disclaimer, the term of this patent is extended or adjusted under 35 U.S.C. 154(b) by 0 days.

(21) Appl. No.: 17/622,808

(22) PCT Filed: Dec. 16, 2021

(86) PCT No.: PCT/CN2021/138728
§ 371 (c)(1),
(2) Date: Dec. 25, 2021

(87) PCT Pub. No.: WO2023/103000
PCT Pub. Date: Jun. 15, 2023

(65) Prior Publication Data
US 2024/0032230 A1    Jan. 25, 2024

(30) Foreign Application Priority Data
Dec. 9, 2021   (CN) .......................... 202111495763.4

(51) Int. Cl.
*H05K 5/03*    (2006.01)

(52) U.S. Cl.
CPC ....................... *H05K 5/03* (2013.01)

(58) Field of Classification Search
None
See application file for complete search history.

(56) References Cited

U.S. PATENT DOCUMENTS 10,198,974 B2 *   2/2019   Yun .................... H10K 50/8426
10,483,491 B2 *   11/2019  Choi ................... G02F 1/133351
(Continued)

FOREIGN PATENT DOCUMENTS

CN      108922981 A     11/2018
CN      209418505 U     9/2019
(Continued)

OTHER PUBLICATIONS

International Search Report in International application No. PCT/CN2021/138728, mailed on Sep. 13, 2022.
(Continued)

*Primary Examiner* — Xanthia C Relford
(74) *Attorney, Agent, or Firm* — PV IP PC; Wei Te Chung; Zhigang Ma

(57) ABSTRACT

A display panel and a display device include a bending region and a non-bending region. The display panel includes a flexible display substrate, a protective film disposed on a surface of the flexible display substrate and covering the non-bending region, and a protective film disposed on a surface of the flexible display substrate and covering the non-bending region. A hollow part is formed in a border region of the bending region and the non-bending region, and the protective adhesive is filled in the hollow part and contacts to the protective film. A technical problem of low reliability of current display panels can be relieved.

20 Claims, 4 Drawing Sheets

(56) References Cited

U.S. PATENT DOCUMENTS

| | | | |
|---|---|---|---|
| 11,119,539 B2* | 9/2021 | Lee | H05K 1/189 |
| 2018/0011576 A1 | 1/2018 | Ryu | |
| 2020/0396547 A1* | 12/2020 | Maenpaa | H04R 7/18 |
| 2021/0029838 A1* | 1/2021 | Lee | B32B 7/14 |
| 2021/0183274 A1 | 6/2021 | Jeon | |
| 2021/0240294 A1* | 8/2021 | Ko | G06F 3/0416 |
| 2021/0354425 A1* | 11/2021 | Zhou | C09J 5/06 |

FOREIGN PATENT DOCUMENTS

| | | | | |
|---|---|---|---|---|
| CN | 110299473 A | | 10/2019 | |
| CN | 110634404 A | | 12/2019 | |
| CN | 210836904 U | | 6/2020 | |
| CN | 211580299 U | * | 9/2020 | |
| CN | 112863355 A | * | 5/2021 | G09F 9/301 |
| CN | 113129747 A | | 7/2021 | |
| CN | 113328056 A | | 8/2021 | |
| CN | 113724597 A | | 11/2021 | |
| IN | 107331795 A | | 11/2017 | |

OTHER PUBLICATIONS

Written Opinion of the International Search Authority in International application No. PCT/CN2021/138728, mailed on Sep. 13, 2022.

Chinese Office Action issued in corresponding Chinese Patent Application No. 202111495763.4 dated Jul. 13, 2022, pp. 1-8.

* cited by examiner

DISPLAY PANEL AND DISPLAY DEVICE

BACKGROUND OF INVENTION

Field of Invention

The present application relates to the field of display technologies, and particularly relates to a display panel and a display device.

Description of Prior Art

With continuous development of display technology, display screens are widely used in various field. Compared to traditional displays, flexible displays have obvious advantages of being lighter and thinner and having a better display effect. Meanwhile, on the basis of characteristics of the flexible display screens, such as bendability, and good flexibility, durability of the flexible display screens is much higher than the traditional displays, which can reduce a probability of accidental damage of equipment in a certain extent.

Current flexible display screens are covered with protective adhesive and protective films. Because contact areas between the protective adhesive and the protective films are relatively small, binding force between the protective adhesive and the protective films are relatively small, resulting in low reliability of the flexible display screens. If the flexible display screens are pulled or pressed by external force, cracks can easy appear in bending regions of the flexible display screens.

SUMMARY OF INVENTION

Embodiments of the present application provide a display panel and a display device, which can increase binding force of a protective adhesive and a protective film and relieves a technical problem of low reliability of current flexible display panels.

One embodiment of the present application provides a display panel, including a bending region and a non-bending region and including:
  a flexible display substrate;
  a protective film disposed on a surface of the flexible display substrate and covering the non-bending region;
  a protective adhesive disposed on a surface of the flexible display substrate and covering the bending region,
  wherein a hollow part is formed in a border region of the bending region and the non-bending region, and the protective adhesive is filled in the hollow part and contacts to the protective film.

In some embodiments of the present application, the hollow part includes a first hollow part formed in the protective film, and the first hollow part extends from an interface of the bending region and the non-bending region to a side away from the protective adhesive.

In some embodiments of the present application, the hollow part further includes a second hollow part formed in the protective film, the first hollow part and the second hollow part are not parallel to each other and communicate with each other, and the second hollow part extends from a communicating surface of the first hollow part to an outer surface of the protective film.

In some embodiments of the present application, the first hollow part includes a first groove, and an extending direction of the first groove is parallel to the interface of the bending region and the non-bending region.

In some embodiments of the present application, the first hollow part includes at least one row of first openings.

In some embodiments of the present application, an arrangement manner of the at least one row of the first openings includes an uniform arrangement manner or a non-uniform arrangement manner.

In some embodiments of the present application, a cross-sectional shape of the at least one row of the first openings includes a circle, a polygonal shape, or an irregular shape.

In some embodiments of the present application, the second hollow part penetrates through two outer surfaces of the protective film disposed opposite to each other.

In some embodiments of the present application, the hollow part includes a third hollow part formed in the flexible display substrate, the third hollow part includes at least one second groove, and the second groove is simultaneously disposed in the bending region and the non-bending region.

In some embodiments of the present application, the hollow part further includes a fourth hollow part formed in the protective film, the fourth hollow part and the third hollow part communicate with each other, and the fourth hollow part extends from a communicating surface of the third hollow part to an outer surface of the protective film.

In some embodiments of the present application, the fourth hollow part penetrates through two outer surfaces of the protective film disposed opposite to each other.

One embodiment of the present application further provides a display device, including a bending region, a non-bending region, and the aforesaid display panel. The display panel includes:
  a flexible display substrate;
  a protective film disposed on a surface of the flexible display substrate and covering the non-bending region;
  a protective adhesive disposed on a surface of the flexible display substrate and covering the bending region,
  wherein a hollow part is formed in a border region of the bending region and the non-bending region, and the protective adhesive is filled in the hollow part and contacts to the protective film.

The display panel and the display device provided by the present application includes a bending region and a non-bending region. The display panel includes a flexible display substrate, a protective film disposed on a surface of the flexible display substrate and covering the non-bending region, and a protective film disposed on a surface of the flexible display substrate and covering the non-bending region. A hollow part is formed in a border region of the bending region and the non-bending region, and the protective adhesive is filled in the hollow part and contacts to the protective film. Because the hollow part increases a contact area between the protective adhesive and the protective film, the binding force between the protective adhesive and the protective film is increased. When the bending region of the flexible display panel is bent, it can prevent a connection position of the protective film and the protective adhesive from cracking under effect of external force, thereby improving reliability of the display panel and effectively relieving the technical problem of low reliability of current flexible display panels.

DESCRIPTION OF DRAWINGS

The technical solutions and other advantageous effects of the present invention will be apparent with reference to the following accompanying drawings and detailed description of embodiments of the present application.

DETAILED DESCRIPTION OF EMBODIMENTS

Figure 1:
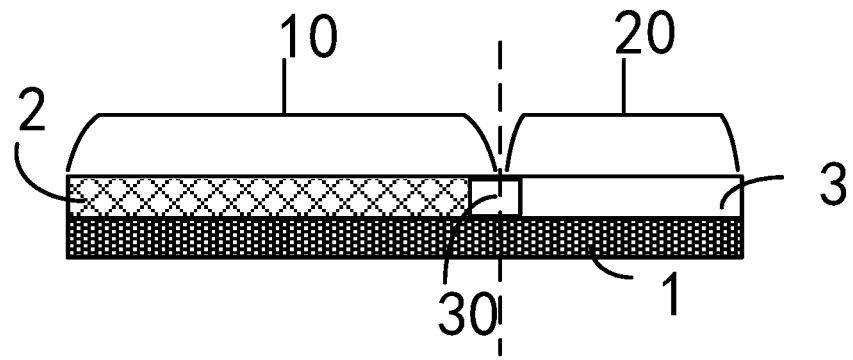
FIG. 1 is a first structural schematic diagram of a display panel provided by one embodiment of the present application.

The specific structural and functional details disclosed are merely representative and are for the purpose of describing exemplary embodiments of the present application. However, the present application may be specifically implemented in many alternative forms and should not be construed as being limited only to the embodiments set forth herein.

In the description of the present application, it is to be understood that the orientation or positional relationship indicated by the terms "center", "transverse", "upper", "lower", "left", "right", "vertical", "horizontal", "top", "bottom", "inside", "outside", etc. is based on the orientation or positional relationship shown in the accompanying figures, which is merely for the convenience for describing of the present application and for the simplification of the description, and is not intended to indicate or imply that the indicated devices or elements have a specific orientation or is constructed and operated in a specific orientation. Therefore, it should not be understood as a limitation on the present application. Moreover, the terms "first" and "second" are used for descriptive purposes only and are not to be understood as indicating or implying relative importance or implicitly indicating the number of the indicated technical characteristics. Therefore, the characteristics defined by "first" or "second" may include one or more of the described characteristics either explicitly or implicitly. In the description of the present application, unless it has another explanation, the meaning of "a plurality" is two or more. Moreover, the terms "comprising" any deformation of them are intended to cover non-exclusive inclusions.

In the description of the present application, unless specified or limited otherwise, terms "mounted," "connected," "coupled," and the like are used in a broad sense, and may include, for example, fixed connections, detachable connections, or integral connections; may also be mechanical or electrical connections; may also be direct connections or indirect connections via intervening structures; may also be inner communications of two elements or may be a relationship of interaction between two elements. For persons skilled in the art in this field, the specific meanings of the above terms in the present application can be understood with specific cases.

The terms used herein is for the purpose of describing specific embodiments only and is not intended to limit exemplary embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

The present application will be further described in detail below in combination with the drawings and embodiments.

As illustrated in FIG. 1, FIG. 1 is a structural schematic diagram of a display panel provided by one embodiment of the present application, which includes a bending region 20 and a non-bending region 10. The display panel includes a flexible display substrate 1, a protective film 2 disposed on a surface of the flexible display substrate 1 and covering the non-bending region 10, and a protective film 3 disposed on a surface of the flexible display substrate 1 and covering the non-bending region 20. Wherein, a hollow part 30 is formed in a border region of the bending region 20 and the non-bending region 10, and the protective adhesive 3 is filled in the hollow part 30 and contacts to the protective film 2.

Wherein, the bending region 20 has bendability and a bending function, while the non-bending region 10 cannot realize the bendability and the bending function. In this embodiment, because the protective adhesive 3 covers the bending region 20, it can be attached well with the flexible display substrate 1 to protect the flexible display substrate 1.

Furthermore, the protective film 2 has certain rigidity and stiffness, which can serve protective effect to the flexible display substrate 1 when being impacted by an external force. In actual application processes, the protective film can be made of one or more materials selected from one or more of poly(vinylidene chloride), ethylene-vinyl alcohol copolymer, polyamide, polyester, or polyimide to prevent the display panels from being polluted, corroded or scratched by impurities during production, transportation, storage, and usage processes. Specifically, poly(vinylidene chloride) is a kind of polymer material with desired flame resistance, corrosion resistance and air tightness, etc. Molecular chain of the ethylene-vinyl alcohol copolymer is tight, which performs excellent barrier ability. Polyamide is commonly known as nylon and has a good barrier ability. The most common and widely used materials in polyester are polyethylene terephthalate (PET) and polyethylene naphthalate two formic acid glycol ester (PEN). Polyimide has advantages of a good thermal stability, high strength, high stiffness, good insulation, good flame retardancy, non-toxic, and non-polluting, etc. Poly(vinylidene chloride), ethylene-vinyl alcohol copolymer, polyamide, polyester, and polyimide all have good performance of blocking water vapor and/or air, which can protect the flexible display substrate 10 from erosion of water vapor and/or air.

The protective adhesive 3 includes ultraviolet (UV) curable adhesive. Wherein, the UV curable-adhesive, also known as ultra-violet light curable adhesive, which has one component and does not contain solvent. The UV curable and visible light-curable adhesive or sealant has advantages of fast curing, low energy consumption, and no solvent pollution, etc., which is new energy-saving and environmentally-friendly adhesive and has been applied in fields of electronic components and daily life. Specifically, the UV curing refers to that a photoinitiator in adhesive is rapidly decomposed into radicals or cations under irradiation of ultraviolet light of appropriate wavelength and light intensity, thereby initiating polymerization of unsaturated bonds to solidify materials. In addition, the protective adhesive 3 still has good flexibility after curing. The protective adhesive 3 covers the surface of the flexible display substrate 1 located in the bending region 20, and can be better attached to the flexible display substrate 1 to protect the flexible display substrate 1.

Figure 2:
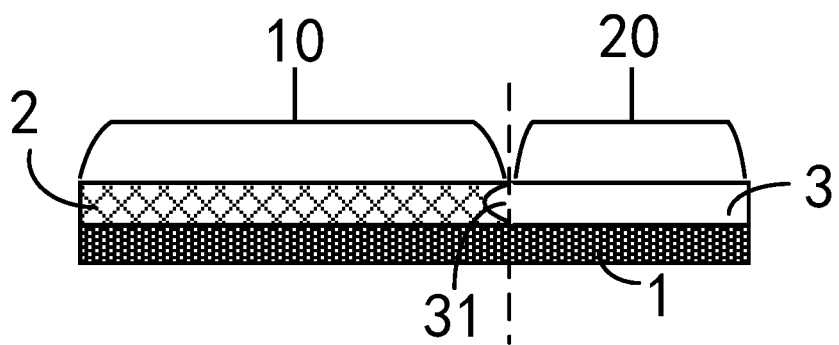
FIG. 2 is a second structural schematic diagram of the display panel provided by one embodiment of the present application.
Figure 3:
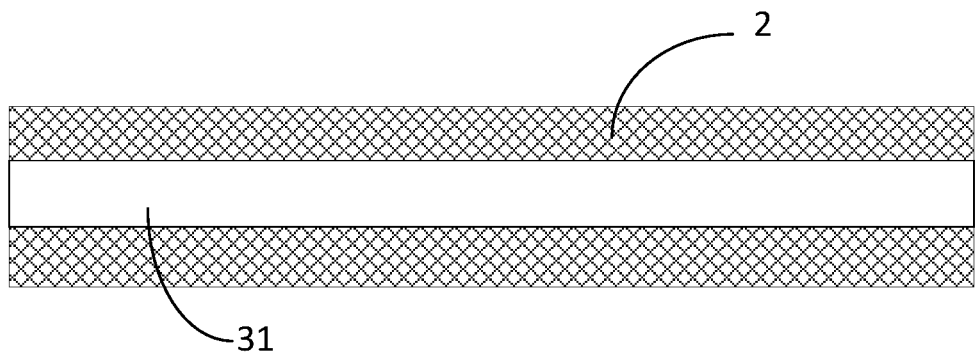
FIG. 3 is a schematic diagram of a cross section of a first hollow part provided by one embodiment of the present application.

Specifically, in one embodiment, as illustrated in FIG. 2 and FIG. 3, the hollow part includes a first hollow part formed in the protective film 2, and the first hollow part extends from an interface of the bending region 20 and the non-bending region 10 to a side away from the protective adhesive 3. Wherein, the first hollow part includes a first groove 31. The first groove 31 includes a groove opening and a groove bottom, and the groove bottom extends to a side away from the protective adhesive 3. During a coating process, the protective adhesive 3 flows from the groove opening to the groove bottom by fluidity, so that the protective adhesive 3 is fitted into the first groove 31.

Specifically, configuration of the first groove 31 increases an contact area between the protective adhesive 3 and the protective film 2, thereby increasing the binding force between the protective adhesive 3 and the protective film 2, and improving reliability of the display panel. When the bending region 20 is bent, occurrence of cracks at a connection position of the protective film 2 and the protective adhesive 3 incurred by effect of external force can be prevented better. In this embodiment, an extending direction of the first groove 31 is parallel to the interface of the bending region 20 and the non-bending region 10. Optionally, the extending direction of the first groove 31 can also be oblique to the interface of the bending region 20 and the non-bending region 10, i.e., not parallel.

Figure 4:
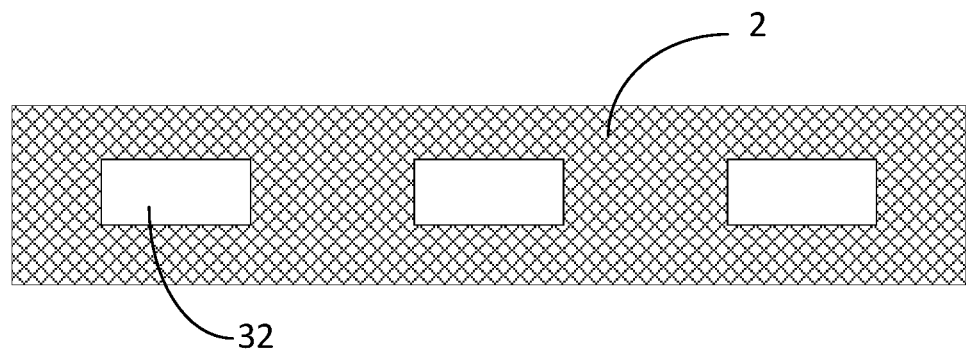
FIG. 4 is a schematic diagram of another cross section of the first hollow part provided by one embodiment of the present application.

Furthermore, as illustrated in FIG. 4, the first hollow part can also be at least one row of first openings 32. Optionally, the first openings 32 may be arranged uniformly (a distance between adjacent first openings 32 is equal) or arranged non-uniformly, and sizes of each first opening 32 can be equal or unequal. Cross-sectional shapes of each opening 32 can be same or different, for example, a circle, a polygonal shape, or an irregular shape. In this embodiment, each of the first opening 32 is arranged uniformly, and the cross-sectional shape of each of the first openings 32 is rectangular.

Figure 5:
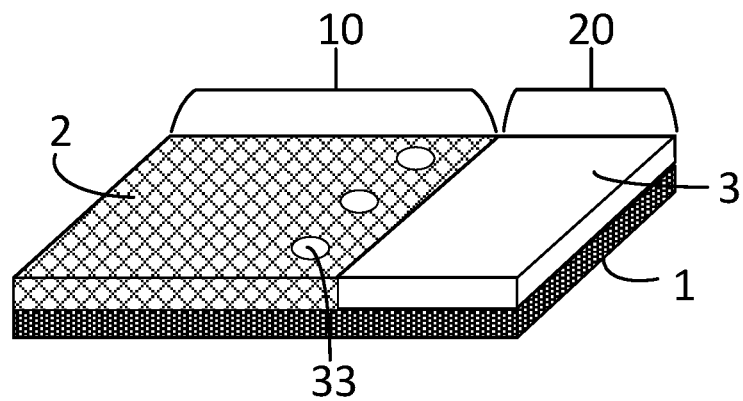
FIG. 5 is a third structural schematic diagram of the display panel provided by one embodiment of the present application.
Figure 6:
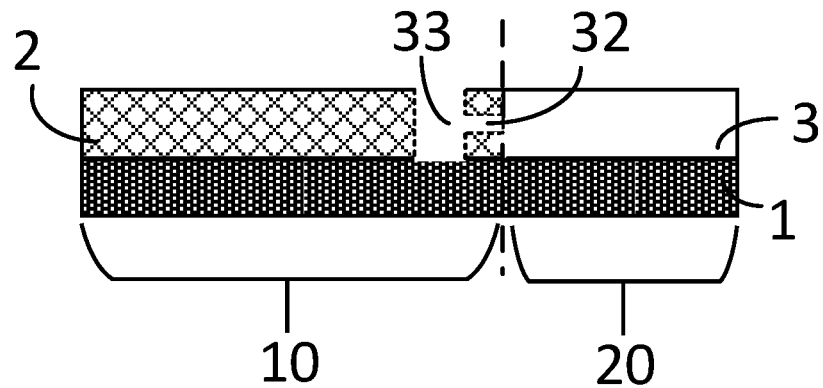
FIG. 6 is a fourth structural schematic diagram of the display panel provided by one embodiment of the present application.
Figure 7:
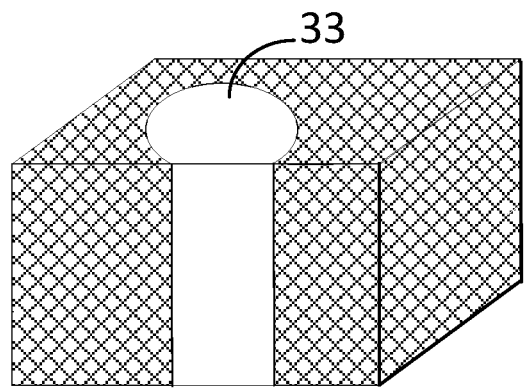
FIG. 7 is a schematic diagram of a cross section of a second hollow part provided by one embodiment of the present application.

In another embodiment, the hollow part further includes a second hollow part formed in the protective film 2, the first hollow part and the second hollow part are not parallel to each other (i.e., an included angle exists between the first hollow part and the second hollow part) and communicate with each other, and the second hollow part extends from a communicating surface of the first hollow part to an outer surface of the protective film 2. Wherein, the first hollow part is at least one row of the first openings or the first groove. As illustrated in FIG. 5, FIG. 6, and FIG. 7, in this embodiment, the first hollow part is at least one row of the first openings 32, and the second hollow part includes at least one row of corresponding second openings 33. The first openings 32 are perpendicular to the second openings 33, and the second hollow part penetrates through two outer surfaces of the protective film 2 disposed opposite to each other. The second openings 33 can be any shape, and the shape of the second openings 33 is not specifically limited here.

Wherein, during a coating process, the protective adhesive 3 flows from the first opening 32 to the second opening 33 by fluidity to fill the first opening 32 and the second opening 33. As inner surfaces of the first openings 32 and the second openings 33 both contact to the protective film 3, a contact area of the protective adhesive 3 and the protective film 2 is further increased, the binding force between the protective adhesive 3 and the protective film 2 is increased, thereby improving reliability of the display panel. When the bending region 20 is bent, occurrence of cracks at a connection position of the protective film 2 and the protective adhesive 3 incurred by effect of external force can be prevented better. In addition, because the second opening 33 penetrates through two outer surfaces of the protective film 2 disposed opposite to each other, the protective adhesive 3 can contact to a part of the surface on the flexible display substrate 1 in the non-bending region 10, so that binding force between the protective adhesive 3 and the flexible display substrate 1 located in the non-bending region 10 is increased, which further improves the reliability of the display panel.

Figure 8:
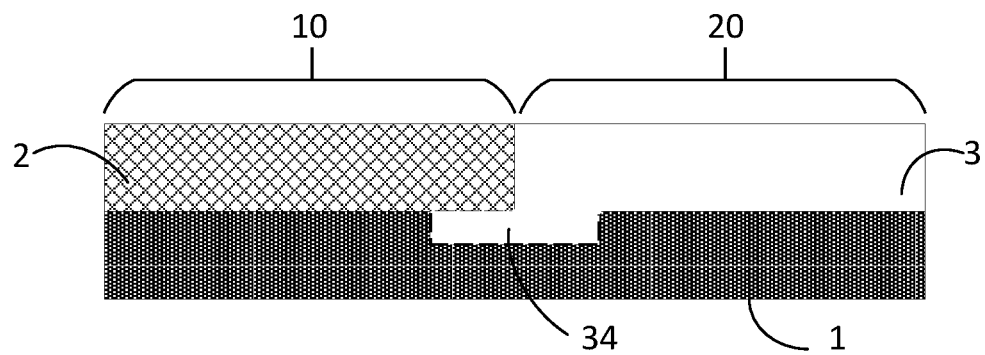
FIG. 8 is a fifth structural schematic diagram of the display panel provided by one embodiment of the present application.

Furthermore, in another embodiment, as illustrated in FIG. 8, the hollow part further includes a third hollow part formed in the flexible display substrate 1, the third hollow part includes at least one second groove 34, and the second groove 34 is simultaneously disposed in the bending region 20 and the non-bending region 10. Wherein, a part of a groove opening of the second groove 34 is located in the bending region 20, another part of the groove opening is located in the non-bending region 10. The protective film 2 and the protective adhesive 3 communicate with the second groove 34 through the groove opening of the second groove 34. The second groove 34 can be any shape, and the shape of the second groove 34 is not specifically limited here.

In actual application processes, during a coating process, the protective adhesive 3 flows from a part of groove openings of bending region 20 to the second groove 34 by fluidity. With continuous filling of the protective adhesive 3, a height of the protective adhesive 3 in the second groove 34 continues to rise, until the adhesive 3 rises to a plane of the part of the groove openings in the non-bending region 10 and contacts to the protective film 2.

Specifically, because the two outer surfaces of the protective film 2 (the outer surface close to the part of the groove opening in the non-bending region 10 and an outer surface adjacent to the outer surface and close to the bending region 20) both contact to the protective adhesive 3, the contact area of the protective film 2 and the protective adhesive 3 is effectively increased, thereby increasing the binding force of the protective film 2 and the protective adhesive 3. In addition, because the protective adhesive 3 contacts to the flexible display substrate 1 through the groove bottom of the second groove 34, the binding force between the protective adhesive 3 and the flexible display substrate 1 located in the non-bending region 10 is increased, which further improves the reliability of the display panel.

Figure 9:
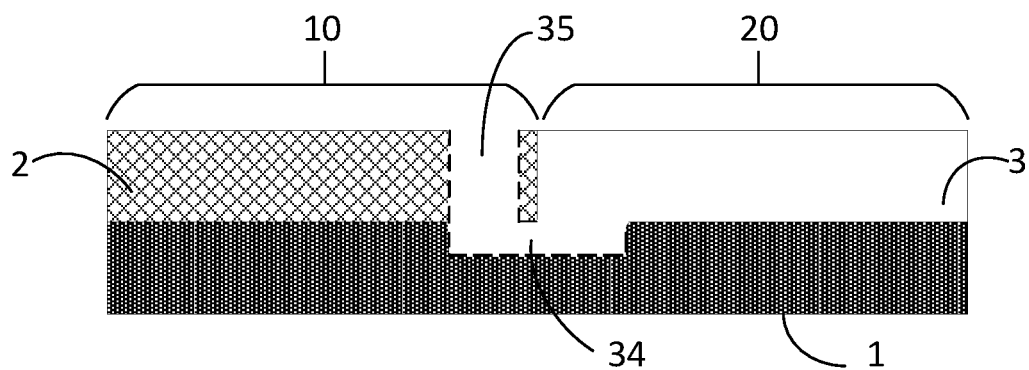
FIG. 9 is a sixth structural schematic diagram of the display panel provided by one embodiment of the present application.

Furthermore, in another embodiment, as illustrated in FIG. 9, the hollow part further includes a fourth hollow part formed in the protective film 2, the fourth hollow part and the third hollow part communicate with each other, and the fourth hollow part extends from a communicating surface of the third hollow part to an outer surface of the protective film 2. Wherein, the fourth hollow part penetrates through two outer surfaces of the protective film 2 disposed opposite to each other. Optionally, the fourth hollow part can be third openings 35, and the third openings 35 can be any shape. The shape of the third openings 35 is not specifically limited here.

During a coating process, the protective adhesive 3 flows from the second groove 34, i.e., the third hollow part, to the third opening 35 by fluidity to fill the second opening 34 and the third opening 35. As inner surfaces of the second grooves 34 and the third openings 35 both contact to the protective film 3, a contact area of the protective adhesive 3 and the protective film 2 is further increased, the binding force between the protective adhesive 3 and the protective film 2 is increased, thereby improving reliability of the display panel. When the bending region 20 is bent, occurrence of cracks at a connection position of the protective film 2 and the protective adhesive 3 incurred by effect of external force can be prevented better. In addition, because the third opening 35 penetrates through two outer surfaces of the protective film 2 disposed opposite to each other, the protective adhesive 3 can contact to a part of the surface on the flexible display substrate 1 in the non-bending region 10, so that binding force between the protective adhesive 3 and the flexible display substrate 1 located in the non-bending region 10 is increased, which further improves the reliability of the display panel.

The display panel provided by the present application includes the bending region and the non-bending region. The display panel includes the flexible display substrate, the protective film disposed on the surface of the flexible display substrate and covering the non-bending region, and the protective film disposed on the surface of the flexible display substrate and covering the non-bending region. The hollow part is formed in the border region of the bending region and the non-bending region, and the protective adhesive is filled in the hollow part and contacts to the protective film. Because the hollow part increases a contact area between the protective adhesive and the protective film, the binding force between the protective adhesive and the protective film is increased. When the bending region of the flexible display panel is bent, it can prevent a connection position of the protective film and the protective adhesive from cracking under effect of external force, thereby improving reliability of the display panel and effectively relieving the technical problem of low reliability of current flexible display panels.

Figure 10:
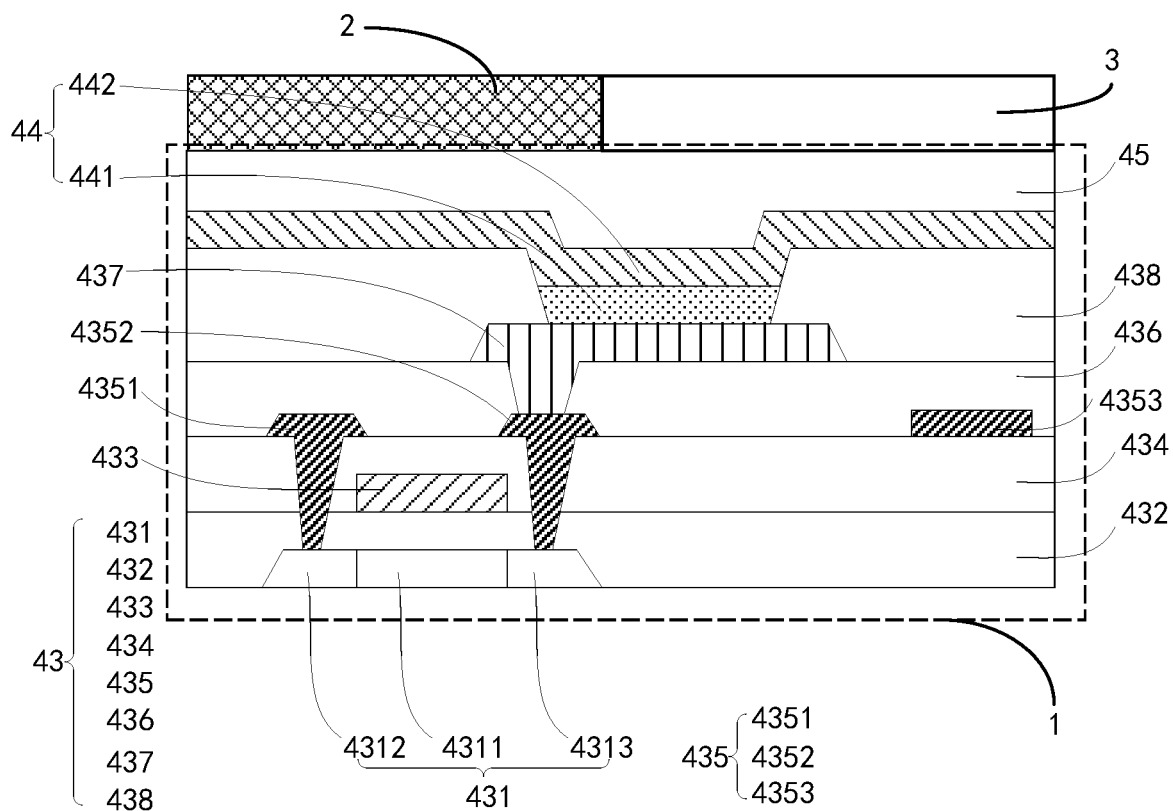
FIG. 10 is a structural schematic diagram of a display device provided by one embodiment of the present application.

As illustrated in FIG. 10, one embodiment of the present application further provides a display device, including a bending region (not shown in the figure), a non-bending region (not shown in the figure), and a display panel. Wherein, the display panel includes a flexible display substrate 1, a protective film 2 disposed on a surface of the flexible display substrate 1 and covering the non-bending region, and a protective film 3 disposed on a surface of the flexible display substrate 1 and covering the non-bending region. Wherein, a hollow part (not shown in the figure) is formed in a border region of the bending region and the non-bending region, and the protective adhesive 3 is filled in the hollow part and contacts to the protective film 2.

Specifically, the flexible display panel 1 includes a driving circuit layer 43, a light-emitting functional layer 44, and an encapsulation layer 45 disposed sequentially in a stack. The hollow part can be formed in the protective film 2 and can also be formed in the encapsulation layer 45 of the flexible display substrate 1. A specific structure of the hollow part please refer to the aforesaid embodiments, and redundant description will not be mentioned herein again.

Furthermore, the driving circuit layer 43 includes an active layer 431, a gate insulation layer 432, a gate electrode 433, an interlayer insulation layer 434, a source-drain layer 435, a planarization layer 436, a pixel electrode 437, and a pixel definition layer 438 stacked in sequence. The active layer 431 includes a channel region 4311, and a source electrode region 4312 and a drain electrode region 4313 located on two sides of the channel region 4311. The gate insulation layer 432 covers on the active layer 431, the gate electrode 433 is disposed on the gate insulation layer 432, and the gate electrode 433 and the channel region 4311 are disposed correspondingly.

The interlayer insulation layer 434 covers the gate electrode 433 and the gate insulation layer 432. The source-drain electrode layer 435 is disposed on the interlayer insulation layer 434. The source-drain layer 435 is patterned to form a source electrode 4351, a drain electrode 4352, and data lines 4353, etc. The source electrode 4351 is connected to a source region 4312 through a via hole of the interlayer insulation layer 434. The drain electrode 4352 is connected to a drain region 4313 through another via hole of the interlayer insulation layer 434.

The planarization layer 436 covers the source-drain layer 435 and the interlayer insulation layer 434. Disposing the planarization layer 436 can provide a flat film surface for the flexible display panel 4, so that the stability of manufacturing the light-emitting functional layer 43 is improved. The pixel electrode 437 is disposed on the planarization layer 436, and is connected to the source electrode 4351 or the drain electrode 4352 through the via hole of the planarization layer 436.

It should be noted that the structure of the driving circuit layer 43 of the present application is not limited to that illustrated in this embodiment. The driving circuit layer 43 of the present application can also include more or fewer film layers, and positional relations of each film layer is not limited to that illustrated in this embodiment. For example, the gate electrode layer 433 can also be located under the active layer 431 to form a bottom-gate structure. The driving circuit layer 43 is configured to provide a driving voltage to the light-emitting functional layer 44 to make the light-emitting functional layer 44 emit light.

The light-emitting functional layer 44 includes light-emitting units and a cathode 442. The light-emitting units 441 are formed by disposing light-emitting materials of different colors on in an entire surface manner on a surface of the driving circuit layer 43. The light-emitting materials of different colors emit light of different colors, for example, red light-emitting materials emit red light, green light-emitting materials emit green light, and blue light-emitting materials emit blue light.

The cathode 442 covers the light-emitting units 441. The light-emitting units 441 emit light under combined action of the pixel electrode 437 and the cathode 442. The light-emitting units 441 of different colors emit lights of different colors, thereby realizing full color display of pixels of a flexible display panel 4.

Optionally, the pixel electrode 437 can be a transparent electrode or a reflective electrode. If the pixel electrode 437 is a transparent electrode, the pixel electrode 437 can be made of, for example, indium tin oxide (ITO), indium zinc oxide (IZO), ZnO, or $In_2O_3$. If the pixel electrode 437 is a reflective electrode, the pixel electrode 437 can include, for example, a reflective layer formed of Ag, Mg, Al, Pt, Pd, Au, Ni, Nd, Ir, Cr, or a combination thereof, or a reflective layer formed of ITO, IZO, ZnO, or $In_2O_3$. However, the pixel electrode 437 is not limited thereto. The pixel electrode 437 can be formed of various materials, and they can also be formed into a single-layer or a multi-layer structure.

It should be noted that whether the transparent electrode or the reflective electrode is adopted on the pixel electrode 437 depends on a light-emitting direction of the flexible display panel 4. When top emission is adopted in the flexible display panel 4, the pixel electrode 437 can be a transparent electrode or a reflective electrode. Of course, an utilization rate of light emitted by the light-emitting units 441 can be improved when the reflective electrode is used. When bottom emission is adopted in the flexible display panel 4, the transparent electrode is adopted in the pixel electrode 437, and the cathode 447 needs to be formed by adopting a transparent conductive material. For example, the cathode 447 can be formed of transparent conductive oxides (TCOs), such as ITO, IZO, ZnO or $In_2O_3$, etc. to improve a transmittance rate of light.

Optionally, the light-emitting functional layer 44 can further include a hole injection layer (HIL) and a hole transport layer (HTL) disposed between the light-emitting units 441 and the pixel electrode 437, and an electron injection layer (EIL) and an electron transport layer (ETL) disposed between the light-emitting units 441 and the cathode 442. The hole injection layer receives the holes transmitted by the pixel electrode 437. The holes are transmitted to the light-emitting units 441 through the hole transport layer. The electron injection layer receives the electrons transmitted by the cathode 442. The electrons are transmitted to the light-emitting units 441 through the electron transport layer. The holes and the electrons combine at positions of the light-emitting units 441 to generate excitons, and the excitons transition from an excited state to a ground state to release energy and emit light.

The encapsulation layer 45 covers the light-emitting functional layer 44, and is used to protect the light-emitting units 441 of the light-emitting functional layer 44 to prevent intrusion of water and oxygen from causing the light-emitting unit 441 to fail. Optionally, the encapsulation layer 45 can be encapsulated by a thin film. For example, the encapsulation layer 45 can be a laminated structure formed by sequentially stacking three layers of films of a first inorganic encapsulation layer, an organic encapsulation layer, and a second inorganic encapsulation layer, or a laminated structure with more stacked layers.

According to the aforesaid embodiments, it can be understood that the display device provided by the present application includes the bending region, the non-bending region, and the display panel. Wherein, the display panel includes the flexible display substrate, the protective film disposed on the surface of the flexible display substrate and covering the non-bending region, and the protective film disposed on the surface of the flexible display substrate and covering the non-bending region. The hollow part is formed in the border region of the bending region and the non-bending region, and the protective adhesive is filled in the hollow part and contacts to the protective film. Because the hollow part increases a contact area between the protective adhesive and the protective film, the binding force between the protective adhesive and the protective film is increased. When the bending region of the flexible display panel is bent, it can prevent a connection position of the protective film and the protective adhesive from cracking under effect of external force, thereby improving reliability of the display panel and effectively relieving the technical problem of low reliability of current flexible display panels.

In the above embodiments, the description of each embodiment has its emphasis, and for some embodiments that may not be detailed, reference may be made to the relevant description of other embodiments.

The embodiments of present application are described in detail above. This article uses specific cases for describing the principles and the embodiments of the present application, and the description of the embodiments mentioned above is only for helping to understand the method and the core idea of the present application. It should be understood by those skilled in the art, that it can perform changes in the technical solution of the embodiments mentioned above, or can perform equivalent replacements in part of technical characteristics, and the changes or replacements do not make the essence of the corresponding technical solution depart from the scope of the technical solution of each embodiment of the present application.

What is claimed is:

1. A display panel, comprising a bending region and a non-bending region and comprising:
   a flexible display substrate;
   a protective film disposed on a surface of the flexible display substrate and covering the non-bending region;
   a protective adhesive disposed on a surface of the flexible display substrate and covering the bending region,
   wherein a hollow part is formed in a border region of the bending region and the non-bending region, and the protective adhesive is filled in the hollow part and contacts to the protective film; and
   wherein the hollow part comprises a third hollow part formed in the flexible display substrate, the third hollow part comprises at least one second groove, and the second groove is simultaneously disposed in the bending region and the non-bending region.

2. The display panel as claimed in claim 1, wherein the hollow part comprises a first hollow part formed in the protective film, and the first hollow part extends from an interface of the bending region and the non-bending region to a side away from the protective adhesive.

3. The display panel as claimed in claim 2, wherein the hollow part comprises a second hollow part formed in the protective film, the first hollow part and the second hollow part are not parallel to each other and communicate with each other, and the second hollow part extends from a communicating surface of the first hollow part to an outer surface of the protective film.

4. The display panel as claimed in claim 3, wherein the second hollow part penetrates through two outer surfaces of the protective film disposed opposite to each other.

5. The display panel as claimed in claim 2, wherein the first hollow part comprises a first groove, and an extending direction of the first groove is parallel to the interface of the bending region and the non-bending region.

6. The display panel as claimed in claim 2, wherein the first hollow part comprises at least one row of first openings.

7. The display panel as claimed in claim 6, wherein an arrangement manner of the at least one row of the first openings comprises an uniform arrangement manner or a non-uniform arrangement manner.

8. The display panel as claimed in claim 6, wherein a cross-sectional shape of the at least one row of the first openings comprises a circle, a polygonal shape, or an irregular shape.

9. The display panel as claimed in claim 1, wherein the hollow part comprises a fourth hollow part formed in the protective film, the fourth hollow part and the third hollow part communicate with each other, and the fourth hollow part extends from a communicating surface of the third hollow part to an outer surface of the protective film.

10. The display panel as claimed in claim 9, wherein the fourth hollow part penetrates through two outer surfaces of the protective film disposed opposite to each other.

11. A display device, comprising a display panel comprising a bending region and a non-bending region, wherein the display panel comprises:
 a flexible display substrate;
 a protective film disposed on a surface of the flexible display substrate and covering the non-bending region;
 a protective adhesive disposed on a surface of the flexible display substrate and covering the bending region,
 wherein a hollow part is formed in a border region of the bending region and the non-bending region, and
 the protective adhesive is filled in the hollow part and contacts to the protective film; and
 wherein the hollow part comprises a third hollow part formed in the flexible display substrate, the third hollow part comprises at least one second groove, and the second groove is simultaneously disposed in the bending region and the non-bending region.

12. The display device as claimed in claim 11, wherein the hollow part comprises a first hollow part formed in the protective film, and the first hollow part extends from an interface of the bending region and the non-bending region to a side away from the protective adhesive.

13. The display device as claimed in claim 12, wherein the hollow part comprises a second hollow part formed in the protective film, the first hollow part and the second hollow part are not parallel to each other and communicate with each other, and the second hollow part extends from a communicating surface of the first hollow part to an outer surface of the protective film.

14. The display device as claimed in claim 13, wherein the second hollow part penetrates through two outer surfaces of the protective film disposed opposite to each other.

15. The display device as claimed in claim 12, wherein the first hollow part comprises a first groove, and an extending direction of the first groove is parallel to the interface of the bending region and the non-bending region.

16. The display device as claimed in claim 12, wherein the first hollow part comprises at least one row of first openings.

17. The display device as claimed in claim 11, wherein the hollow part comprises a fourth hollow part formed in the protective film, the fourth hollow part and the third hollow part communicate with each other, and the fourth hollow part extends from a communicating surface of the third hollow part to an outer surface of the protective film.

18. The display device as claimed in claim 17, wherein the fourth hollow part penetrates through two outer surfaces of the protective film disposed opposite to each other.

19. A display panel, comprising a bending region and a non-bending region and comprising:
 a flexible display substrate;
 a protective film disposed on a surface of the flexible display substrate and covering the non-bending region;
 a protective adhesive disposed on a surface of the flexible display substrate and covering the bending region;
 wherein a hollow part is formed in a border region of the bending region and the non-bending region, and the protective adhesive is filled in the hollow part and contacts to the protective film;
 wherein the hollow part comprises a first hollow part formed in the protective film, and the first hollow part extends from an interface of the bending region and the non-bending region to a side away from the protective adhesive; and
 wherein the hollow part comprises a second hollow part formed in the protective film, the first hollow part and the second hollow part are not parallel to each other and communicate with each other, and the second hollow part extends from a communicating surface of the first hollow part to an outer surface of the protective film.

20. The display panel as claimed in claim 19, wherein the second hollow part penetrates through two outer surfaces of the protective film disposed opposite to each other.

* * * * *